United States Patent
Bussar et al.

(10) Patent No.: US 10,031,185 B2
(45) Date of Patent: Jul. 24, 2018

(54) METHOD FOR DETERMINING A STATE OF CHARGE AND REMAINING OPERATION LIFE OF A BATTERY

(71) Applicant: Exide Technologies, Milton, GA (US)

(72) Inventors: Rainer Bussar, Buedingen (DE); Gerd Wessels Hoogestraat, Bad Lauterberg (DE); Wolfgang Rudolf Fischer, Kefenrod-Bindsachsen (DE); Thomas Hopper, Gelnhausen (DE); Nicolas Henri Bernard Redon, Buedingen (DE); Olaf Sielemann, Waechtersbach (DE); Sebastian Zeh, Kefenrod (DE)

(73) Assignee: EXIDE TECHNOLOGIES, Milton, GA (US)

( * ) Notice: Subject to any disclaimer, the term of this patent is extended or adjusted under 35 U.S.C. 154(b) by 121 days.

(21) Appl. No.: 14/767,393

(22) PCT Filed: Feb. 4, 2014

(86) PCT No.: PCT/US2014/014529
§ 371 (c)(1),
(2) Date: Aug. 12, 2015

(87) PCT Pub. No.: WO2014/126744
PCT Pub. Date: Aug. 21, 2014

(65) Prior Publication Data
US 2015/0377972 A1 Dec. 31, 2015

Related U.S. Application Data

(60) Provisional application No. 61/764,303, filed on Feb. 13, 2013.

(51) Int. Cl.
G01R 31/36 (2006.01)
H01M 10/48 (2006.01)
H02J 7/00 (2006.01)

(52) U.S. Cl.
CPC ....... *G01R 31/3606* (2013.01); *G01R 31/361* (2013.01); *G01R 31/3613* (2013.01);
(Continued)

(58) Field of Classification Search
CPC ............ G01R 31/3606; G01R 31/3679; G01R 31/3648; G01R 31/3613; G01R 31/361;
(Continued)

(56) References Cited

U.S. PATENT DOCUMENTS 8,046,181 B2 10/2011 Kang et al.
2002/0196026 A1 12/2002 Kimura et al.
(Continued)

FOREIGN PATENT DOCUMENTS

DE 102010017504 12/2011
JP 2006340560 12/2006
JP 2009214604 9/2009

OTHER PUBLICATIONS

EP Application No. 14751417.8 Extended European Search Report dated Sep. 27, 2016, 8 pages.
(Continued)

*Primary Examiner* — Fernando Hidalgo
(74) *Attorney, Agent, or Firm* — Cantor Colburn LLP

(57) ABSTRACT

Determining a state of charge (SOC) of a rechargeable battery includes using a first process to determine a first value for the SOC of the battery and using a second process to determine a second value for the SOC of the battery and deriving the SOC as a weighted average of the first value for the SOC and the second value for the SOC. During a charging cycle of the battery an input charge of the battery is determined from an input current flowing into the battery and a charging time. During a discharging cycle an output charge of the battery is determined from an output current flowing out of the battery, a discharging time and an actual
(Continued)

capacity of the battery is the sum of the input charge over charging cycles minus the sum of the output charge over discharging cycles.

17 Claims, 1 Drawing Sheet

(52) U.S. Cl.
CPC ..... *G01R 31/3648* (2013.01); *G01R 31/3679* (2013.01); *H01M 10/48* (2013.01); *H02J 7/0047* (2013.01); *H02J 2007/005* (2013.01)

(58) Field of Classification Search
CPC ... H01M 10/48; H02J 2007/005; H02J 7/0047
USPC .......................................................... 702/63
See application file for complete search history.

(56) References Cited

U.S. PATENT DOCUMENTS

| | | |
|---|---|---|
| 2006/0076929 A1 | 4/2006 | Tatsumi et al. |
| 2010/0194398 A1 | 8/2010 | Kawasumi et al. |
| 2012/0166116 A1 | 6/2012 | Yoshida et al. |
| 2013/0090871 A1 | 4/2013 | Akabori et al. |

OTHER PUBLICATIONS

International Application No. PCT/US2014/014529 International Search Report and Written Opinion dated May 19, 2014, 13 pages.

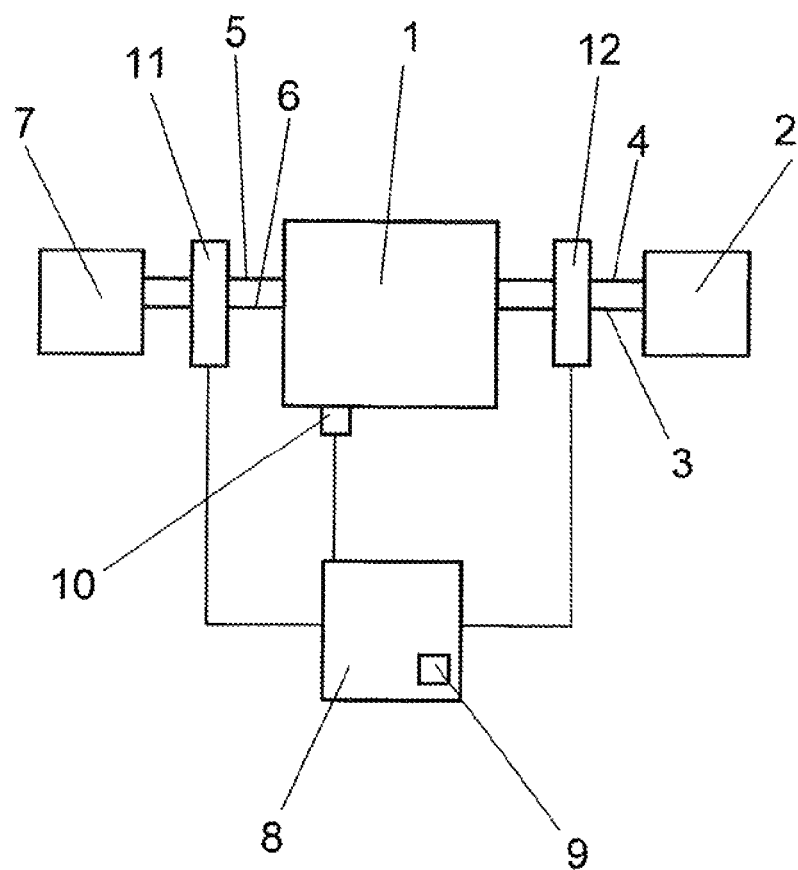

METHOD FOR DETERMINING A STATE OF CHARGE AND REMAINING OPERATION LIFE OF A BATTERY

CROSS REFERENCE TO RELATED APPLICATIONS

This application claims the benefit of U.S. Application No. 61/764,303, filed on Feb. 13, 2013, which is incorporated herein by reference in its entirety.

BACKGROUND

The present application relates to a method for determining a state of charge of a rechargeable battery.

Determining the state of charge (SOC) and the state of health (SOH) of a rechargeable battery are known as challenging problems regarding modern battery technology. This is particular the case as degradation mechanisms in batteries are complex and a detailed analytical description of the electrochemical processes involved is often not available.

However, knowledge about the state of charge and state of health becomes increasingly important as the number of battery-driven applications is increasing.

This is in particular true as a robust state of charge determination for rechargeable batteries is made even more complicated by highly fluctuating load profiles as well as partial recharge cycles involved. The latter is the case for instance in off-grid applications involving renewable energy generation or in electric vehicle applications, wherein recharging of the battery occurs when energy is available, for example when the sun is out and driving a photovoltaic module or a car recuperates energy when breaking. Furthermore diesel generator running time can be reduced in those off-grid applications, which are mainly powered by renewable energy sources and batteries.

Most state of health algorithms rely on a comparison of measured discharge capacities and rated discharge capacities requiring a robust state of charge determination.

While robust SOC and SOH determination is more easily available for batteries of all types once dedicated hardware for measuring these is not an issue, most applications require cost-sensitive designs of the battery control as well as prohibit any interference of the SOC or SOH measurements with the charging or discharging processes.

SUMMARY

The present application relates to a method for determining a state of charge of a rechargeable battery. Determining the state of charge (SOC) and the state of health (SOH) of a rechargeable battery are known as challenging problems regarding modern battery technology. This is particular the case as degradation mechanisms in batteries are complex and a detailed analytical description of the electrochemical processes involved is often not available. Most state of health algorithms rely on a comparison of measured discharge capacities and rated discharge capacities requiring a robust state of charge determination. While robust SOC and SOH determination is more easily available for batteries of all types once dedicated hardware for measuring these is not an issue, most applications require cost-sensitive designs of the battery control as well as prohibit any interference of the SOC or SOH measurements with the charging or discharging processes. Hence it is an object of the present invention to provide a method for a robust state of charge determination. In order to solve this problem a method for determining a state of charge of a rechargeable battery is suggested comprising the steps: using a first process in order to determine a first value for the state of charge of the battery, wherein during a charging cycle of the battery an input charge of the battery is determined from an input current flowing into the battery over a charging time, wherein during a discharging cycle an output charge of the battery is determined from an output current flowing out of the battery over a discharging time, and wherein the first value for the state of charge is the sum of the input charge of the charging cycle minus the sum of the output charge over the discharging cycle, using a second process being different from the first process in order to determine a second value for the state of charge of the battery, and deriving the state of charge as a weighted average of the first value for the state of charge and the second value for the state of charge.

BRIEF DESCRIPTION OF THE DRAWINGS

FIG. 1 shows a block diagram of a battery application implementing a method according to an embodiment of the present invention.

DETAILED DESCRIPTION

One object of the present invention to provide a method for a robust state of charge determination. It may be a further object to provide a method for determination of the state of charge of a rechargeable battery not requiring any costly hardware. It may be an additional object to provide a method for determination of the state of charge of a rechargeable battery not interfering with the charging or discharging cycle for the battery.

At least one of these objects is solved by a method for determining a state of charge of a rechargeable battery comprising the steps: using a first process in order to determine a first value for the state of charge of the battery, wherein during a charging cycle of the battery an input charge of the battery is determined from an input current flowing into the battery over a charging time, wherein during a discharging cycle an output charge of the battery is determined from an output current flowing out of the battery over a discharging time, and wherein the first value for the state of charge is the sum of the input charge of the charging cycle minus the sum of the output charge over the discharging cycle, using a second process being different from the first process in order to determine a second value for the state of charge of the battery, and deriving the state of charge as a weighted average of the first value for the state of charge and the second value for the state of charge.

In the sense of the present application the actual capacity of a rechargeable battery is the predicted capacity being readily available from the battery at a given point in time. This actual capacity may be given in units as for example Ampere-hours (Ah) or Coulomb (C).

When this actual capacity of the battery at a given point in time is compared to the maximum amount of charge available from the battery at the same point in time, the relative value or ratio derived is termed the state of charge (SOC) of the battery in the sense of this application. The maximum charge available from the battery at a given point in time is denoted the available capacity of the battery in the sense of the present application. The available capacity of a battery at a given point in time represents the amount of charge which could be maximally stored in the battery at this given point in time. The SOC may for example be expressed in percentage.

It is apparent that determination of the SOC not only requires determination of the actual capacity of the battery, but also a thorough determination of the available capacity of the battery at the same point in time. Due to degradation of the battery the available capacity of the battery decreases with an increasing number of charging and discharging cycles starting from the rated capacity, for which the battery had initially been designed.

The robustness of the method according to the invention relies on the fact that the state of charge is derived as a weighted average of at least two measured values for the state of charge, which are measured by using two distinct and possibly independent processes.

The first process relies on a counting of the amount of charge flowing in and out of the battery during charging and discharging cycles. In principle the actual from a battery at any given point in time can be derived from an observation of the charge which went into the battery and the charge which went out of the battery.

To effectively perform charge counting the input current may be integrated over charging time and the output current may be integrated over discharging time.

In order to improve the first process for determining the first value for the state of charge of the battery, i.e. an Ah measurement, it is suggested that in an embodiment the input charge is not only determined by integrating the input current over charging time, but also by multiplication with a loss factor representing the losses occurring during charging of the battery.

During a charging cycle some charge flowing into the battery is lost by certain processes during charging of the battery itself, such that the amount of charge being available from the battery is less than the charge which flew into the battery during charging thereof.

In an embodiment this loss factor may be an empirically determined factor being specific either for the particular battery to be charged or for the type of battery to be charged.

In general, the losses involved when charging a battery are increasing with the actual capacity of the battery.

In an embodiment the loss factor is assumed to be continuously increasing with an increasing actual capacity of the battery. This may be accounted for by varying the loss factor over charging time.

In another embodiment the charging cycle is divided into a first part providing charging with constant input current and a second part with constant input voltage, wherein the loss factor is kept constant at a first value during charging with constant current, and wherein the loss factor is kept constant at a second value during charging with constant voltage.

In an example the loss factor is set in a range from 1.0 up to 1.05 for a string voltage smaller than 2.4 V per cell during the phase of charging with constant input voltage and wherein the loss factor is in a range from 1.2 up to 1.4 for a string voltage of 2.4 V per cell during charging with constant voltage. In the sense of the present application the string voltage of a cell is the voltage across a single cell of a battery and the string voltage of the battery is then approximately equal to the string voltage across a single cell multiplied by the number of cells of the battery, assuming that the cells are identical.

In particular, charging currents under a certain given threshold in an embodiment of the invention may not be considered at all, because the charge flowing into the battery will be entirely absorbed or consumed by the losses, such that charging currents below the threshold do not lead to an increase of the actual capacity during this section of the charging. This current threshold is dependent on the cell technology used. In particular, the threshold value may be adjusted in an embodiment dependent on the available operation time of the battery.

In order to avoid possible propagating errors from a continuous charge counting for the battery, a reset of the counter containing information about the sum of charge having flown in and out of the battery (charge counter) is realized in an embodiment. While this reset may be performed on a regular basis after certain time intervals, an embodiment is suggested, wherein a reset of the capacity counter is triggered by the battery during a charging cycle is reaching its available capacity. The reaching of the available capacity is termed the maximum charge condition.

While this maximum charge condition may in an embodiment be defined as a certain threshold of charge flowing into the battery, in an embodiment this maximum charge condition may be measured in order to account for degradation reducing the available capacity of the battery.

In an embodiment of the invention during a charging cycle the input current measured for a constant charging voltage is compared to a preset threshold value for the input current and if the input current drops below the threshold value over a preset time period, the charging process is stopped, assuming that the maximum charge condition of the battery is reached.

In an embodiment of the invention the state of charge of the battery is determined by forming the relationship between the actual capacity of the battery at a given point time and the available capacity of the battery at the same point in time.

In an embodiment the available capacity of the battery is determined as the capacity of the battery measured once the maximum charge condition of the battery is detected.

In an embodiment the charging process is stopped once the input current has dropped below a threshold value and did not change by more than 25% over a time period of 10 seconds.

While the invention so far has been described to make use of two distinct processes for determining a first and a second value for the state of charge of the battery, the present invention is not restricted to two distinct processes only, but may be extended to three and more distinct processes for determining the capacity of the battery. Once more than two processes are used to determine the capacity of the battery, the average may be formed by weighting each of the values for the state of charge determined by the distinct processes in order to determine the state of charge as the weighted average of the values for the state of charge determined by the individual processes.

In order to derive a robust value for the state of charge of the battery an average is formed between the first value for the state of charge derived by the first process, i.e. by charge counting, and the second value for the state of charge derived by the second process, wherein the two values are weighted, wherein the weighting represents some knowledge about the trustworthiness of the first and second processes.

Accordingly, in an embodiment of the present invention the step of deriving the state of charge of the battery further comprises the steps: comparing the first value for the state of charge with the second value of the state of charge, wherein the difference between the first value of the state of charge and the second value of the state of charge is smaller than or equal to a predetermined threshold, deriving the state of charge of the battery as the weighted average of the first value for the state of charge and the second value for the state of charge, wherein the weighting of the first value for the state of charge is equal to the weighting for the second value for the state of charge, and wherein the difference between the first value of the state of charge and the second value of the state of charge is larger than the predetermined threshold, deriving the state of charge as the weighted average of the first value for the state of charge and the second value for the state of charge, wherein the weighting of each of the two values for the state of charge represents a trustworthiness of the respective process for determining the first and second values for the capacity.

For example both processes may be equally weighted once the first and second values derived thereof are within a limit of about 10% points. In this case for a deviation larger than 10% points each of the values is weighted on basis of its trustworthiness.

In an embodiment the trustworthiness is set between 0, which means that the value is not trustworthy, and 1, which means that the value is fully trustworthy.

In an embodiment the initial weighting of each of the values for the capacity of the battery may be determined as a coefficient of determination (R2) of a curve fitting the measurements according to each individual method.

In another embodiment the weights derived as the R2 values for the individual values for the capacity is used as an initial weighting only, which will be modified further during the lifetime of the battery taking into account individual requirements of each of the processes. For example in an embodiment the weighting of the first value for the capacity derived by charging counting is decreased once the favourable resets of the charge counter are not performed regularly.

In an embodiment each individual value for the state of charge as determined by one of the distinct processes is compared by an outlier test, such as for example the t-test or Grubb's test for outliers, against the most recent values derived by the same process.

Furthermore, a $\overline{X}$ vs. R plot of the values subsequently determined by the same process could be used in order to identify outliers. It is evident that a value identified as an outlier will either not be used at all for forming the average value (trustworthiness and weighting=0) or will only be assigned a very low trustworthiness and thus will receive only a minor weighting.

In an embodiment the battery is cycled over a preset number of cycles before being put in use, while letting the distinct processes to determine the first and second values for the actual capacity of the battery run in parallel and performing a regular capacity test for a number of times. These values may then be used in order to determine the real actual capacity of the battery or the real state of charge. The deviation of each individual process accumulated over the predetermined number of cycles and their difference from the real actual capacity of the battery can then be used in order to provide a weighting for each individual process during practical use of the battery.

While the first process according to the present invention is a charge counting process, the second and each further process may be freely chosen from a number of processes available for determining the actual capacity of the rechargeable battery.

According to an embodiment the second process comprises the steps: interrupting or reducing a charging or discharging current during a charging cycle or a discharging cycle, measuring an evolution of battery voltage over time for a first period of time, extrapolating the evolution of battery voltage over time for a second period of time, wherein the first period of time is shorter than the second period of time, determining a relaxed battery voltage at the end of the second period of time as the open circuit voltage (OCV), and calculating the second value for the actual capacity from the open circuit voltage.

While it may be favourable to interrupt charging or discharging current for a measurement of an evolution of battery voltage over time for the first period of time, this may interfere with a battery user's requirements, in particular once a discharging process is considered. However, the same process may be used while an interruption of the charging or discharging current is replaced by a reduction of the charging or discharging current. In particular during a discharging process this is a frequently occurring incident anyway as different loads are switched, changing the overall load connected to the battery and leading to a discharging thereof.

In order to calculate the state of charge on basis of the extrapolated open circuit voltage one may assume that one may assume that the open circuit voltage linearly increases with increasing actual capacity or increasing state of charge of the battery.

In an embodiment a discharging current is interrupted or reduced, wherein the evolution of battery voltage over time is measured for less than 60 seconds and the evolution of battery voltage over time is extrapolated over at least 20 hours.

In another embodiment, a charging current is interrupted or reduced, wherein the evolution of battery voltage over time is measured for less than 150 seconds, and wherein the evolution of battery voltage over time is extrapolated over at least 20 hours.

It has turned out that determination of the state of charge by extrapolating the evolution of the battery voltage over time after interruption or reduction of the charging current is more reliable during the phase of charging having constant current than during the phase of charging having constant voltage. Thus when it comes to deriving the overall state of charge as a weighted average of the first value for the state of charge and the second value for the state of charge the weighting representing the trustworthiness of the state of charge determined during a phase of constant current is greater than a weighing representing the trustworthiness of the state of charge determined during a phase of constant voltage.

While in a first simplified model the extrapolation of the evolution of battery voltage over time is based on the assumption that after switching of the current the battery voltage U behaves as $$U = n \times \ln(1+t) + m,$$

wherein m is the initial voltage at the beginning of the relaxation process (t=0), i.e. immediately after interrupting or reducing the charging current, wherein n is a constant parameter being characteristic for the type and design of battery used, and t is the time in seconds starting at t=0 after switching or reducing the charging current. E.g. parameter n for batteries having porous electrodes depends on diffusion of the electrolyte into the electrodes. For lead acid batteries the value for n depends on the porosity, thickness and geometry of the active mass. m and n are constant values derived from fitting of voltage relaxation to the measured evolution of battery voltage over time, Thus the relaxed open circuit voltage OCV in an embodiment, wherein the battery voltage over time after interruption or reduction of the charging current is measured for less than 150 seconds and extrapolated over 24 hours then is given as $$OCV = n \times \ln(1+86400) + m.$$

Another potential algorithm to be used in order to determine the open circuit voltage OCV (wherein the current I is zero) from an extrapolation of the evolution of battery voltage V over time t is:

$$V(I=0) = OCV\left(1 - K_0 e^{-\frac{1}{t0}} - K_1 e^{-\frac{1}{t1}}\right)$$

(When t→infinite U(I=0)=OCV),
wherein OCV, K0, t0, K1 and t1 are parameters for fitting of the measured voltage evolution over time, provided that t0 is in a range of about 2 s to 3 s and t2 is in a range of about 30 s to 40 s. The OCV value and K0 and K1 are obtained by at least square regression. In this case the OCV value is derived by an extrapolation of the fitted curve for an infinite time.

In another example for a second process which can be used in an embodiment according to the present invention in order to determine a second value for the state of charge of the battery during a charging cycle of the battery an average voltage across the battery is determined from the voltage across the battery measured over time during charging of the battery, and wherein a value for the state of charge of the battery is calculated from the average voltage across the battery during charging. It is assumed that during measurement of the average voltage the current is kept constant.

In order to calculate the state of charge from the average voltage derived during a charging cycle one may assume that state of charge linearly increases with increasing average voltage of the battery during charging.

In addition to determining the state of charge of the rechargeable battery in an embodiment of the invention an indicator for remaining operation lifetime of the battery is determined.

In an embodiment such an indicator may be determined by measuring the actual charge throughput through the battery during its entire operation. An indicator for remaining operation lifetime of the battery can then be determined as a relation between the actual charge throughput through the battery and a predetermined charge throughput through the battery.

The argument behind this is that a given battery is designed for a certain predetermined charge throughput during its entire operation lifetime. Thus if one puts this predetermined charge throughput of the battery in relation to the actual charge throughput up-to-date, one will receive an indicator for the remaining operation lifetime of the battery.

Such a relation may either be a difference or a ratio. If one for example knows what the monthly charge throughput through the battery is, one may even express the indicator for remaining operation lifetime in terms of remaining time, e.g. months.

In an embodiment the actual charge throughput through the battery is further multiplied by a stress factor reflecting the conditions of the battery during charging thereof.

It has turned out that the remaining operation lifetime of a battery strongly depends for example on temperature of the battery during charging thereof. The higher the temperature of the battery during each charging cycle is, the shorter the operation lifetime will be. Thus if the actual charge throughput through the battery up-to-date is multiplied by a stress factor reflecting for example the temperature conditions of the battery during charging before being put in relation to the predetermined designed charge throughput through the battery over its entire operation lifetime, a better estimate for the remaining operation lifetime of the battery can be established.

In addition to determining the actual capacity or the SOC of a rechargeable battery in an embodiment according to the present invention a fitness factor for the battery is determined, which compares the determined or measured available capacity of the battery with a calculated available capacity of the battery.

In order to calculate the calculated available capacity of a battery one may assume that the available capacity of a battery decreases linearly with the number of recharging cycles during its operation lifetime. The linear decrease of the available capacity is described by a slope x being specific for the type of battery used. It is assumed that the available capacity starts at a value, for which the battery is designed, i.e. the rated capacity of the battery.

Furthermore one may assume that after a certain number l of charging cycles with a certain percentage DoD of the battery capacity of a fully charged battery, the available capacity of the battery has dropped below a certain threshold. Once the available capacity has dropped below this threshold T (given in % of the nominal or rated capacity $C_{nominal}$) it is assumed that the battery has reached its formal end of life criteria. The total amount of charge $Q_{total}$ flowing through the battery during its operational life is then given as $$Q_{total} = l \cdot DoD \cdot C_{nominal}$$

wherein $C_{nominal}$ is the rated or nominal capacity of the battery, for which the battery is designed.

The slope x of the linear degradation process is thus given as $$x = \frac{100\% - T}{0 - Q_{total}}$$

In an easy model the available capacity of a battery $C_{max;available}$ in a certain cycle i may be described as $$C_{max;available}(i) = x \times (i \times C_{nominal}) + C_{nominal}.$$

For typical batteries the slope of degradation x is in a range from −0.0001 to −0.0003.

In an embodiment the indicator for the remaining operation lifetime of the battery may be modified by a factor taking into account the fitness factor of the battery.

While in the present application the term battery is used in order to describe a rechargeable accumulator, it may be assumed that the battery comprises a number of cells such that the method claimed could also be applied to an individual cell of such a battery without departing from the scope of protection of the present application.

In an embodiment of the invention the method for determining an state of charge of a battery is applied to a lead acid battery.

Further advantages, features and applications of the present invention will become apparent according to the following description of an embodiment and the attached figures.

As far as the above embodiments of the invention may be at least partly realised, wherein a software controlled data processing is used, it is apparent that a computer program, which implements such control and a storage medium on which the computer program is stored have to be considered aspects of the invention.

FIG. 1 shows a block diagram of a typical battery setting implementing an embodiment of the method according to the present invention for determining the state of charge of the battery 1 during operation thereof. In the shown example the battery 1 is used to drive a transceiver 2 for a mobile telecommunications network. The connection between the battery 1 and the transceiver 2 is schematically depicted by two wires 3, 4.

In order to be able to house the arrangement at a location having no link to an electric supply grid, the battery 1 is connected via wires 5, 6 to a photovoltaic module 7. In the shown example, the battery 1 is a rechargeable lead acid battery, which can be recharged by charge gained from the photovoltaic module 7. The setting further comprises a battery controller 8 which not only enables connection or disconnection of battery 1 to the load 2 or to the charge source 7, but also enables determination of the state of charge of the battery 1 when in use.

Furthermore, the battery controller 8 comprises an interface 9, which connects the battery control 8 via the Internet to an external operator. In the present example the interface 9 is a wireless communications interface providing an UMTS connectivity.

In order to determine the state of charge of the rechargeable battery 1 the battery control 8 is connected to a number of detection devices 10, 11, 12. The detection device 10 is a temperature detector enabling a monitoring of the battery temperature, in particular during charging cycles. The detecting device 11 allows a measurement of the current flowing from the photovoltaic module during a charging cycle of the battery 1 into the battery. The detection device 12 allows to monitor the current flowing out of battery 1 into the load 2 during discharging of the battery 1. In addition the detecting device 12 enables a monitoring of the battery voltage during a discharging cycle.

In order to determine a robust value for the state of charge of the battery during operation of the battery 1 in the field, the battery control 8 is arranged such that it determines the available capacity of the battery 1 with two distinct processes in parallel.

The first process used in order to determine the state of charge of the battery 1 is so-called charge counting. Determining the actual capacity of the battery 1 based on charge counting assumes that all charge flowing into the battery will be available from the battery at a later stage. So once over a certain period of time all charge flowing into the battery is measured as well as all charge flowing out of the battery the sum of the values will give a good estimate for the actual charge available from the battery at a given point in time, i.e. the actual capacity of the battery at this point in time.

Thus the actual capacity Cactual after a number I of charging and discharging cycles is given as:

$$C_{actual\_i} = C_{actual\_(i-1)} \begin{cases} -\sum I_{string_i}^{discharge} \Delta t_i & \text{during discharge} \\ +\sum \dfrac{I_{string_i}^{charge}}{cf} \Delta t_i & \text{during charge} \end{cases},$$

wherein $I_{string_i}^{discharge}$ is the discharge current available from the battery during the i-th discharge cycle, $I_{string_i}^{charge}$ is the charging current during i-th charging cycle, and $\Delta t_i$ is the duration of the current flow during the i-th charging or discharging cycle.

The formula given for determining the actual capacity of the battery 1 by charge counting assumes that the charge flowing into the battery and measured via a current measurement at the detection device 11 experiences losses, such that charges are lost by certain processes and while flowing into the battery will not be available from the battery for discharging the battery. For the present case it is assumed that the loss factor is in a range from 1.0 to 1.05 for a string voltage Ustring during charging at constant voltage is smaller than 2.4 Volts per cell multiplied by the number of cells contributing to the string voltage and the loss factor cf is in a range from 1.2 to 1.4 for a string voltage Ustring of 2.4 Volts per cell multiplied by the number of cells contributing to the string voltage.

The actual capacity determined by charge counting may now be used to derive the state of charge of the battery 1 by forming the ratio between the actual capacity and the available capacity of the battery.

Thus one requires the available capacity of the battery 1. The available capacity of the battery when putting the battery 1 in use well corresponds to the rated or nominal capacity of the battery, for which the battery had been designed. However the rated capacity after some time after putting the battery in use would lead to a wrong state of charge as it would neglect degradation effects of the battery occurring with each charging and discharging cycle.

Thus, the battery controller 8 regularly performs a determination of the available capacity. At this stage, the controller 8 replaces the formally determined value for the available capacity by the actual capacity measured by charge counting, once it determines that the battery during charging thereof reaches a maximum charge condition.

In order to determine the maximum charge condition of the battery, the input current of the battery during charging thereof is constantly monitored. It can be assumed that the charging current of the battery 1 notably drops once the charge flowing into the battery has reached the available capacity of the battery. Thus, the controller 8 has a preset threshold value and it detects when the input current of the battery 1 at the detection device 11 drops below the threshold value. Once the input current has dropped below the threshold value and did not change by more than 25% over a time period of 10 seconds. After each determination of the available capacity the threshold value is readjusted.

If the maximum charge condition is reached, charging of the battery 1 is stopped by the battery control 8 and the actual capacity of the battery determined when the charging is stopped is set as the available capacity of the battery.

Subsequently, the state of charge of the battery may be determined any point in time as a ratio between the actual capacity and the available capacity as set before.

In order to make the value for the state of charge more robust, the control 8 determines the state of charge of the battery using a second process. In the process implemented in the controller 8 according to FIG. 1 the second process for determining the state of charge of the battery is based on a measurement of a voltage evolution of the voltage of the battery 1 measured by the detection device 12 when the discharging current from the battery 1 into the load 2 is interrupted or reduced. In the present example, notable reduction in the discharging current may occur once the broadcasting power of the telecommunications transceiver 2 is reduced. As this reduction in the power consumption of the transceiver 2 is an inherent feature of the load 2 itself, the reduction need not be triggered by the controller 8. Further it is important to note that thus the reduction of the discharging current is not influencing the performance of the load 2.

After reduction of the power of the transceiver 2, the evolution of the battery voltage is measured over time by the detection device 12 for about 40 seconds. Afterwards the evolution of the battery voltage over time is extrapolated over 24 h. The extrapolated relaxed battery voltage after 24 h is set as the open circuit voltage.

This open circuit voltage is then used in order to determine the state of charge of the battery. It may be assumed that the open circuit voltage after 24 h of relaxation is linearly dependent on the state of charge of the battery. In order to determine the state of charge of the battery 1 from the open circuit voltage, the extrapolated open circuit voltage is used to calculate the state of charge, wherein $$SOC = \frac{OCV - b}{m},$$

wherein m is the slope of the linear function describing the dependency of the open circuit voltage on the state of charge and b is the offset for a state of charge of 0%. m and b can be empirically derived for each individual type of battery. This value for the state of charge forms the second value for the state of charge in the sense of the present application.

In order to obtain a robust value for the state of charge, the first value for the state of charge determined by charge counting and the second value for the state of charge determined by open circuit voltage extrapolation are used to form an average value.

This forming of the average value for the state of charge of the battery 1 in the controller 8 takes into account that the two processes may have different reliability depending not only on the inherent advantages and disadvantages of each of the processes, but also on the operation of the battery itself.

As implemented in the controller 8 according to FIG. 1, the average state of charge $\overline{SOC}$ is thus derived as follows:

$$\overline{SOC} = \frac{trust_1 \cdot SOC_1 + trust_2 \cdot SOC_2}{trust_1 + trust_2},$$

wherein SOC1 denotes the state of charge determined by the first process, i.e. by charge counting, SOC2 denotes the state of charge as determined by the second process, i.e. open circuit voltage determination, and trust1, trust2 are factors of trustworthiness for the first and second processes, respectively.

The factors of trustworthiness trust1, trust2 each have a value between 0, which means that the value for the SOC is not trustworthy, and 1, which means that the value for the SOC is fully trustworthy.

Once a comparison of the first value for the state of charge and the second value for the state of charge, leads to the result that the difference between the two values is smaller than or equal to ten percent than the weighting of the first value for the state of charge is equal to the weighting for the second value for the state of charge.

If however wherein the difference between the first value of the state of charge and the second value of the state of charge is larger than ten percent the weighting of each of the two values for the state of charge represents a trustworthiness of the respective process The initial weighting of each of the values SOC1, SOC2 in this case be determined as the coefficient of determination (R2) of a curve fitting the measurements according to each of the two processes.

However, the weights derived as the R2 values for the individual values for the state of charge are used as an initial weighting only, which will be modified further during the lifetime of the battery taking into account individual requirements of each of the processes. In particular the weighting of the first value for the state of charge derived by charging counting is decreased once resetting of the charge counter and setting of the available capacity are not performed regularly.

In an alternative embodiment the detection device 12 could be arranged to determine the average voltage across the battery over time during a charging cycle of the battery by measuring a voltage across the battery over time and wherein a value for the state of charge of the battery is calculated from the average voltage across the battery during charging. In order to calculate the state of charge from the average voltage derived during a charging cycle one may assume that state of charge linearly increases with increasing average voltage of the battery during charging.

In addition to determining the state of charge of the rechargeable battery 1 the controller 8 is arranged to provide an indicator for remaining operation lifetime of the battery.

This indicator is determined by measuring the actual charge throughput through the battery during its entire operation and relating the actual charge throughput through the battery to a predetermined charge throughput through the battery. The indicator for remaining operation lifetime is expressed in terms of remaining months of operation.

The actual charge throughput through the battery is multiplied by a stress factor reflecting the temperature of the battery during charging thereof. The temperature of the battery is continuously monitored by the thermometer 10 connected to the controller 8. The higher the temperature of the battery during each charging cycle is, the shorter the operation lifetime will be.

In addition to determining the SOC and the remaining operational lifetime of the battery 1 a fitness factor for the battery is determined, which compares the determined available capacity of the battery with a calculated available capacity of the battery.

What is claimed is:

1. A method for determining a state of charge of a rechargeable battery (1) comprising:

providing a first current detection device between a battery and a charge source, the first current detection device configured to measure current flowing during charging of said battery;

providing a second current detection device between a battery and a load, the second current detection device configured to measure current flowing during discharging of said battery; and providing a battery controller, the battery controller in communication with the first and second detection devices and configured to selectively connect and disconnect the battery to the charge source and the load, respectively, the controller configured to determine the state of charge of the battery via at least two processes;

using a first process in order to determine a first value for the state of charge of the battery (1), wherein during at least one charging cycle of the battery (1) an input charge of the battery (1) is determined from an input current flowing into the battery (1) and a charging time, wherein during at least one discharging cycle an output charge of the battery (1) is determined from an output current flowing out of the battery (1) and a discharging time, and wherein an actual capacity of the battery is the sum of the input charge over all charging cycles minus the sum of the output charge over all discharging cycles, wherein the available capacity of the battery is determined, and wherein the first value for the state of charge is the ratio between the actual capacity and the available capacity of the battery at a given point in time;

using a second process being different from the first process in order to determine a second value for the state of charge of the battery (1); and deriving the state of charge as a weighted average of the first value for the state of charge and the second value for the state of charge.

2. A method according to claim 1, wherein the step of deriving the state of charge of the battery (1) further comprises:

comparing the first value for the state of charge with the second value for the state of charge, when the difference between the first value and the second value is smaller than or equal to a predetermined relative threshold, deriving the state of charge as the weighted average of the first value and the second value, wherein the weighting of the first value is equal to the weighting of the second weighting, and when the difference between the first value and second value is larger than the predetermined relative threshold, deriving the state of charge as the weighted average of the first value and the second value, wherein the weighting of each the two values are not equal and are derived via outlier tests for the first and second values for the state of charge.

3. A method according to one of the previous claims, wherein weightings of said first and second processes are initially represented by coefficients of determination (R2) of curves fitting the measured values of the respective first and second processes.

4. A method according to one of the previous claims, wherein for determining the input charge the input current is integrated over charging time and the result of integration is multiplied by a loss factor representing the losses occurring during charging of the battery (1).

5. A method according to claim 4, wherein the loss factor is varied over charging time.

6. A method according to claim 5, wherein a charging cycle is divided into a first part providing charging with constant input current and a second part with constant input voltage, wherein the loss factor is kept constant at a first value during charging with constant current, and wherein the loss factor is kept constant at a second value during charging with constant voltage.

7. A method according to one of the previous claims, wherein during a charging cycle the input current measured for a constant charging voltage is compared to a preset threshold value and if the input charge drops below the threshold value over a preset time period, stopping the charging cycle.

8. A method according to claim 7, wherein the charging cycle is stopped once the input current has dropped below the threshold value and did not change by more than 25% over a time period of 10 seconds.

9. A method according to one of claim 7 or 8, wherein when the charging cycle is stopped the actual capacity of the battery (1) measured is set as the available capacity of the battery (1).

10. A method according to one of claims 7 to 9, wherein after stopping the charging cycle the charge counter is reset.

11. A method according to one of the previous claims, wherein the second process comprises the steps:

interrupting or reducing a charging or discharging current during a charging cycle or a discharging cycle, measuring an evolution of battery voltage over time for a first period of time, extrapolating the evolution of battery voltage over time for a second period of time, wherein the first period of time is shorter than the second period of time, determining a relaxed battery voltage at the end of the second period of time as the open circuit voltage, and calculating the second value for the state of charge of the battery from the open circuit voltage.

12. A method according to claim 11, wherein a discharging current is interrupted or reduced, wherein the evolution of battery voltage over time is measured for less than 60 seconds and the evolution of battery voltage over time is extrapolated over at least 20 hours.

13. A method according to claim 11, wherein a charging current is interrupted or reduced, wherein the evolution of battery voltage over time is measured for less than 150 seconds, and wherein the evolution of battery voltage over time is extrapolated over at least 20 hours.

14. A method according to one of the previous claims, wherein during a charging cycle of the battery an average voltage across the battery is determined from a voltage across the battery (1) measured over time during charging of the battery (1) and wherein a value for the state of charge of the battery (1) is calculated from the average voltage across the battery (1) during charging.

15. A method according to one of the previous claims, wherein the actual charge throughput through the battery (1) is measured, and an indicator for remaining operation life time of the battery (1) is determined as a relation between the actual charge throughput through the battery (1) and a predetermined charge throughput though the battery (1).

16. A method according to claim 15, wherein the actual charge throughput through the battery (1) is multiplied by a stress factor reflecting the conditions of the battery (1) during charging thereof.

17. A non-transitory computer readable medium embodying a computer program having a code for carrying out a method according to one of the previous claims.

* * * * *